United States Patent
Taniguchi

(10) Patent No.: US 11,473,901 B2
(45) Date of Patent: Oct. 18, 2022

(54) HEIGHT MEASUREMENT DEVICE IN WHICH OPTICAL PATHS PROJECTED ON THE SAMPLE AT DIFFERENT INCIDENCE ANGLES

(71) Applicant: Hitachi High-Tech Corporation, Tokyo (JP)

(72) Inventor: Koichi Taniguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/056,279

(22) PCT Filed: May 29, 2018

(86) PCT No.: PCT/JP2018/020450
§ 371 (c)(1),
(2) Date: Nov. 17, 2020

(87) PCT Pub. No.: WO2019/229826
PCT Pub. Date: Dec. 5, 2019

(65) Prior Publication Data
US 2021/0254964 A1    Aug. 19, 2021

(51) Int. Cl.
*G01B 11/06* (2006.01)
*G01B 11/04* (2006.01)
*G01B 11/25* (2006.01)

(52) U.S. Cl.
CPC ........ *G01B 11/0608* (2013.01); *G01B 11/043* (2013.01); *G01B 11/2518* (2013.01)

(58) Field of Classification Search
CPC .............. G01B 11/0608; G01B 11/043; G01B 11/2518; G01B 15/00; G01B 2210/56; H01J 37/28
See application file for complete search history.

(56) References Cited

U.S. PATENT DOCUMENTS

| | | | |
|---|---|---|---|
| 5,227,862 A * | 7/1993 | Oshida | G01B 11/26 356/490 |
| 5,929,983 A | 7/1999 | Lu | |

(Continued)

FOREIGN PATENT DOCUMENTS

| | | |
|---|---|---|
| JP | 3-120403 A | 5/1991 |
| JP | 10-318718 A | 12/1998 |

(Continued)

OTHER PUBLICATIONS

International Search Report (PCT/ISA/210) issued in PCT Application No. PCT/JP2018/020450 dated Jul. 10, 2018 with English translation (six (6) pages).

(Continued)

*Primary Examiner* — Michael P LaPage
(74) *Attorney, Agent, or Firm* — Crowell & Moring LLP

(57) ABSTRACT

The purpose of the present invention is to provide a height measurement device with which, even when the height of a sample surface varies considerably, it is possible, with a relatively simple configuration, to perform height measurement with high accuracy at various heights. In order to achieve the abovementioned purpose, proposed is an optical height measurement device characterized by being provided with: a stage for retaining a sample; a stage driving unit for adjusting the stage at different heights; a projection optical system for projecting light onto the sample; a detection optical system for receiving light reflected from the sample; and a processing unit for measuring the height of the sample on the basis of a signal outputted from the detection optical system, wherein the projection optical system is provided with a light source that emits light, and an optical path dividing element for branching the optical path of the light emitted from the light source, and the detection optical system is provided with a sensor for receiving light reflected from the sample, and an element for adjusting the light path (Continued)

of the light reflected from the sample in the direction of the sensor prior to reception of the light by the sensor.

9 Claims, 20 Drawing Sheets

(56) References Cited

U.S. PATENT DOCUMENTS

| | | | |
|---|---|---|---|
| 6,031,615 A | 2/2000 | Meeks et al. | |
| 6,428,171 B1* | 8/2002 | Aoki | G01B 11/0608 |
| | | | 250/559.38 |
| 8,619,235 B2* | 12/2013 | Van Drent | G03F 9/7034 |
| | | | 355/72 |
| 2002/0053634 A1* | 5/2002 | Watanabe | B82Y 40/00 |
| | | | 250/201.2 |
| 2005/0052634 A1 | 3/2005 | Sugihara et al. | |
| 2011/0317172 A1* | 12/2011 | Tamiya | G01B 11/2441 |
| | | | 356/614 |
| 2012/0206710 A1* | 8/2012 | Niemela | G01N 21/41 |
| | | | 356/4.07 |
| 2013/0128247 A1* | 5/2013 | Khuat Duy | G03F 9/7034 |
| | | | 355/63 |
| 2016/0048969 A1* | 2/2016 | Zhao | G01B 11/0608 |
| | | | 348/136 |
| 2017/0108444 A1 | 4/2017 | Otani et al. | |
| 2018/0283853 A1* | 10/2018 | Pandey | G01B 11/2513 |

FOREIGN PATENT DOCUMENTS

| | | |
|---|---|---|
| JP | 2002-365232 A | 12/2002 |
| JP | 2005-45164 A | 2/2005 |
| JP | 2007-306013 A | 11/2007 |
| JP | 2014-95612 A | 5/2014 |
| JP | 2016-8941 A | 1/2016 |

OTHER PUBLICATIONS

Japanese-language Written Opinion (PCT/ISA/237) issued in PCT Application No. PCT/JP2018/020450 dated Jul. 10, 2018 (four (4) pages).

* cited by examiner

HEIGHT MEASUREMENT DEVICE IN WHICH OPTICAL PATHS PROJECTED ON THE SAMPLE AT DIFFERENT INCIDENCE ANGLES

TECHNICAL FIELD

The present disclosure relates to a height measurement device which measures the height of a sample and particularly relates to a height measurement device provided in a beam irradiation device which adjusts the focus of a beam according to height measurement of a sample.

BACKGROUND ART

In the semiconductor manufacturing process, an optical inspection device or an inspection device using an electron beam is used in order to detect various foreign substances or pattern defects and detect problems in various manufacturing devices to prevent damage to the product.

In an optical inspection device, if a deviation occurs between the focusing plane of the detection optical system and the surface of the sample, the image quality will deteriorate due to defocusing of the optical image and the detection accuracy will be impaired.

The same is true for a CD-SEM (Critical Dimension-Scanning Electron Microscope) which is used to measure fine pattern widths and hole diameters using an electron beam and a focusing error in an electronic optical system can lead to a measured value error or, in an appearance inspection device using an electron beam, can lead to false pattern detection.

For the above reason, it is important to measure the height of the sample with high accuracy and make an adjustment to adjust the focus to the height.

Patent Literature 1 discloses a device which projects light on the surface of a sample from an inclined direction and detects the reflected light to measure the change in the sample height. Specifically, it describes a device in which light is reflected on the sample surface and the change in the height is measured according to detection of displacement of the position of the image formed on the detecting surface of the detector.

CITATION LIST

Patent Literature

Patent Literature 1: Japanese Patent Application Laid-Open No. 2014-095612

SUMMARY OF INVENTION

Technical Problem

According to the height detection method disclosed in Patent Literature 1, change in the height of a sample is grasped and the device condition can be adjusted so as to compensate for the change. On the other hand, since light is radiated from an inclined direction, if a large height difference exists between the reference height and the sample surface, light may be radiated on a position different from the position where height measurement should be made. In addition, the size of the detecting surface of the detector which receives reflected light is limited and the range in which height measurement can be made with high accuracy is limited.

Hereinafter, there is proposed a height measurement device which has an object to, even if the sample surface height considerably varies, make height measurement at each height with high accuracy with a relatively simple configuration.

Solution to Problem

As one aspect to achieve the above object, there is proposed an optical height measurement device characterized by being provided with: a stage for retaining a sample; a stage driving unit for adjusting the stage at a plurality of heights; a projection optical system for projecting light onto the sample; a detection optical system for receiving reflected light from the sample; and a processing unit for measuring the height of the sample on the basis of a signal outputted from the detection optical system. The projection optical system is provided with a light source for emitting light and an optical path dividing element for branching the optical path of the light emitted from the light source, and the detection optical system is provided with a sensor for receiving the reflected light from the sample and an element for adjusting the optical path of the reflected light from the sample to the direction of the sensor prior to reception of the light by the sensor.

Advantageous Effects of Invention

According to the above structure, even if the sample height considerably varies, height measurement can be made at each height with high accuracy.

DESCRIPTION OF EMBODIMENTS

In the embodiments described below, an explanation will be given of a height measurement device which mainly measures the height of a sample and even if the height of the sample surface considerably varies, can make height measurement at each height with high accuracy.

First Embodiment

Figure 1:
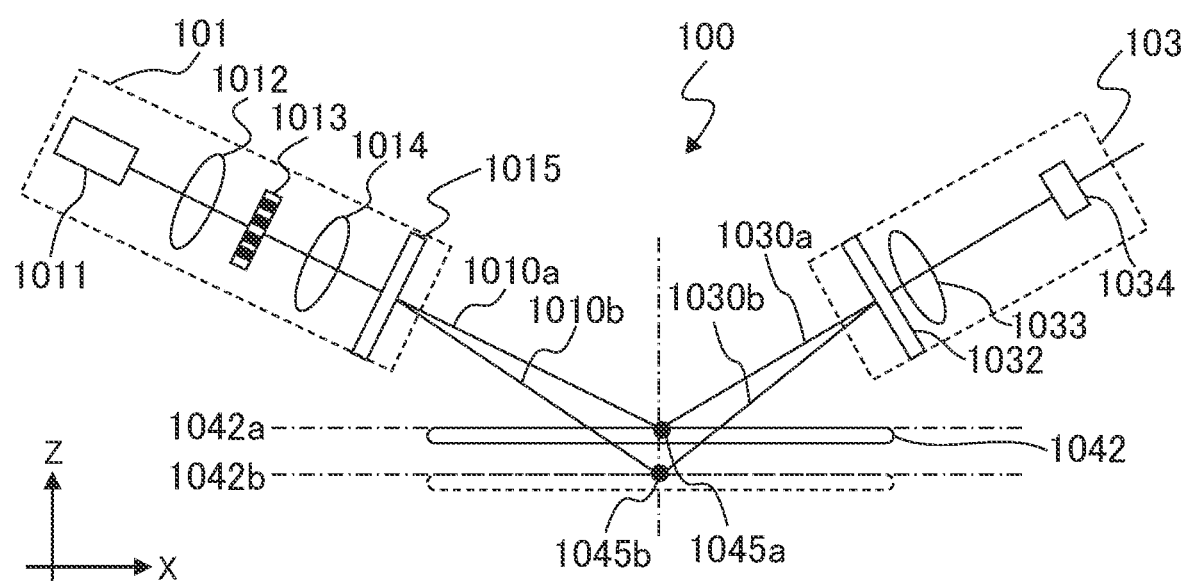
FIG. 1 is a schematic view of an optical height measurement device.

FIG. 1 is a view which shows the outline of an optical height measurement device. A height measurement device 100 includes a projection optical system 101 and a detection optical system 103. The light projected from the projection optical system 101 is reflected on the surface of a sample 1042 placed on a stage and enters the detection optical system 103. The projection optical system which projects light on the sample includes a light source 1011, a condenser lens 1012, a pattern mask 1013 with an opening made to transmit light partially, an imaging lens 1014, and an optical path dividing element 1015. Usually, a sample is placed on the stage. The detection optical system which receives reflected light from the sample includes an optical path adjusting element 1032, an imaging lens 1033, and a sensor 1034.

The projection optical system 101 is described below. The light emitted from the light source 1011 is concentrated by the condenser lens 1012. The light concentrated by the condenser lens 1012 passes through the opening made in the pattern mask 1013. Since the pattern mask 1013 like this is placed between the light source 1011 and the sample 1042, an image whose shape is the same as the opening is projected on the sample. Also, the light which passed through the opening forms an image on the sample through the imaging lens 1014.

It is desirable that the pattern mask 1013 should have a plurality of openings. The light reflected by the sample arrives at the sensor 1034 of the detection optical system and the sensor 1034 takes an opening image which is projected on the sample.

Output of the sensor 1034 is transmitted to an arithmetic processing unit (not shown), and according to a predetermined relational expression or table of difference $\Delta s$ between the image arrival position on the sensor 1034 and the reference position and displacement $\Delta z$ of sample height, the arithmetic processing unit calculates $\Delta z$. In this embodiment, an explanation is given of an example that $\Delta z$ is outputted as a specific length; however, for example, in the case of a device in which the stage is moved to compensate for the displacement of the sample surface from the reference position, another parameter which changes depending on displacement of the arrival position of the image on the sensor (parameter which changes depending on sample height), such as a control signal for displacement feedback, may be calculated. For example, in the case of a piezo actuator to drive the stage in the z direction, a relational expression or table which indicates the relation between control voltage and displacement of the arrival position of the image on the sensor may be prepared so that a control signal is supplied to the piezo actuator according to calculation using the relational expression or reference to the table.

In this embodiment, the optical path dividing element 1015 is placed between the imaging lens 1014 and the sample. This arrangement is for the purpose of dividing the light forming an image through the imaging lens in two or more directions (two directions in the example of FIG. 1).

Figure 2:
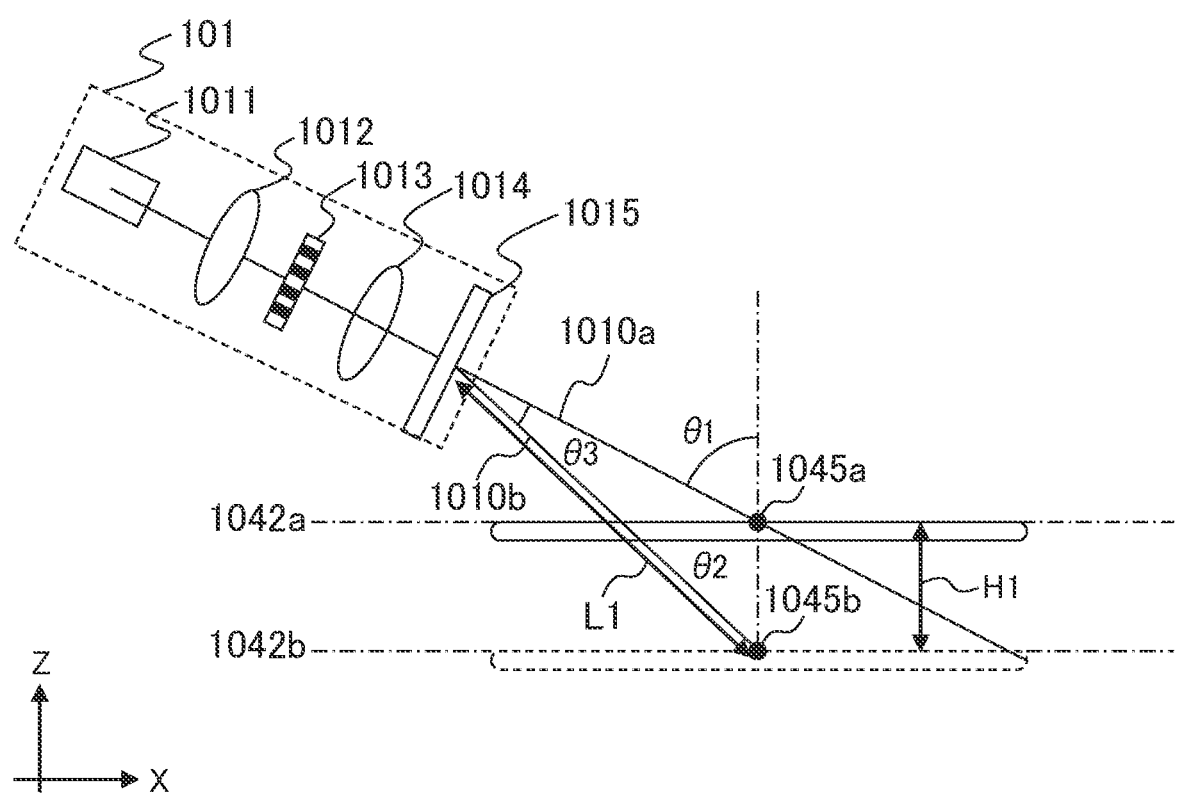
FIG. 2 is a schematic view of arrangement of an optical path dividing element on the projection optical system side.

The condition for arrangement of the optical path dividing element 1015 on the projection optical system side is explained below, referring to FIG. 2. For the convenience of explanation, two types of height are assumed and an explanation is given of an example of height measurement with a first height 1042a as a reference and a second height 1042b different from it. However, the invention is not limited thereto and for example, an element which divides the optical path in three or more directions may be adopted.

The projection optical system 101 is installed so that when the sample surface is positioned at the first height 1042a as the reference, light is projected on a height measuring point 1045a. The light emitted from the light source 1011 passes through the imaging lens 1014 and then enters the height measuring point 1045a (trajectory 1010a) while keeping its trajectory (incidence angle $\theta 1$). In this embodiment, the angle relative to the normal direction of the sample surface is defined as an incidence angle; however, the invention is not limited thereto and for example, the angle relative to the sample surface may be defined as an incidence angle.

On the other hand, with the second height 1042b lower than the first height by H1, if the projection optical system 101 projects light at incidence angle $\theta 1$, the height cannot be detected. The light entering at $\theta 1$ is reflected on the sample surface at the same angle as the incidence angle, but the reflected light does not come within the range in which the sensor can receive light, and thus cannot be detected. Therefore, in order to enable height detection with the second height 1042b as well, light is made to enter along a trajectory 1010b (incidence angle $\theta 2$) and arrive at the height measuring point 1045b.

In this embodiment, in order to make the light pass along the trajectory 10101b, the optical path dividing element 1015 is placed between the imaging lens 1014 and the sample. The light which passed through the imaging lens 1014 is branched into two trajectories 1010a and 1010b by the optical path dividing element 1015. The optical path dividing element 1015 divides the light with the optical path dividing element 1015 as a branch point in a virtual plane including the light passing on the trajectory 1010a and the trajectory of the first light 1030a as its reflected light.

The height difference between the first height 1042a and the second height 1042b is H1. The position at the second height 1042b which corresponds to the height measuring point 1045a is height measuring point 1045b. The distance between the optical path dividing element 1015 and the height measuring point 1045b is expressed as L1 and the relative angle between the trajectory 1010a and trajectory 1010b is defined as θ3. Geometrically, θ3 is calculated in accordance with θ3=f(L1, H1, θ1). The height difference H1 is determined according to the height position of the second height 1042b.

The orientation of the projection optical system 101 is fixed and the position of the imaging lens 1014 in the projection optical system is also fixed. The optical path adjusting element 1015 is placed between the imaging lens 1014 and the height measuring point 1045a. On the straight line connecting the imaging lens 1014 and the height measuring point 1045a, a space in which the optical path dividing element can be spatially inserted is selected. The optical path dividing element 1015 is placed at an optimum position that satisfies θ3=f(L1, H1, θ1). Possible methods for dividing the optical path may be spatial division, wavelength division, polarization division and the like. For example, as the optical path dividing element 1015, a diffraction grating, birefringent element, split lens or the like is used as described in the second and subsequent embodiments. Since they have different characteristics, the angle at which the optical path can be divided differs according to the characteristic. For this reason, the dividing element 1015 is arranged so that the angle at which the optical path can be divided by the optical path dividing element 1015 according to its characteristic roughly coincides with the desired dividing angle θ3.

Figure 3:
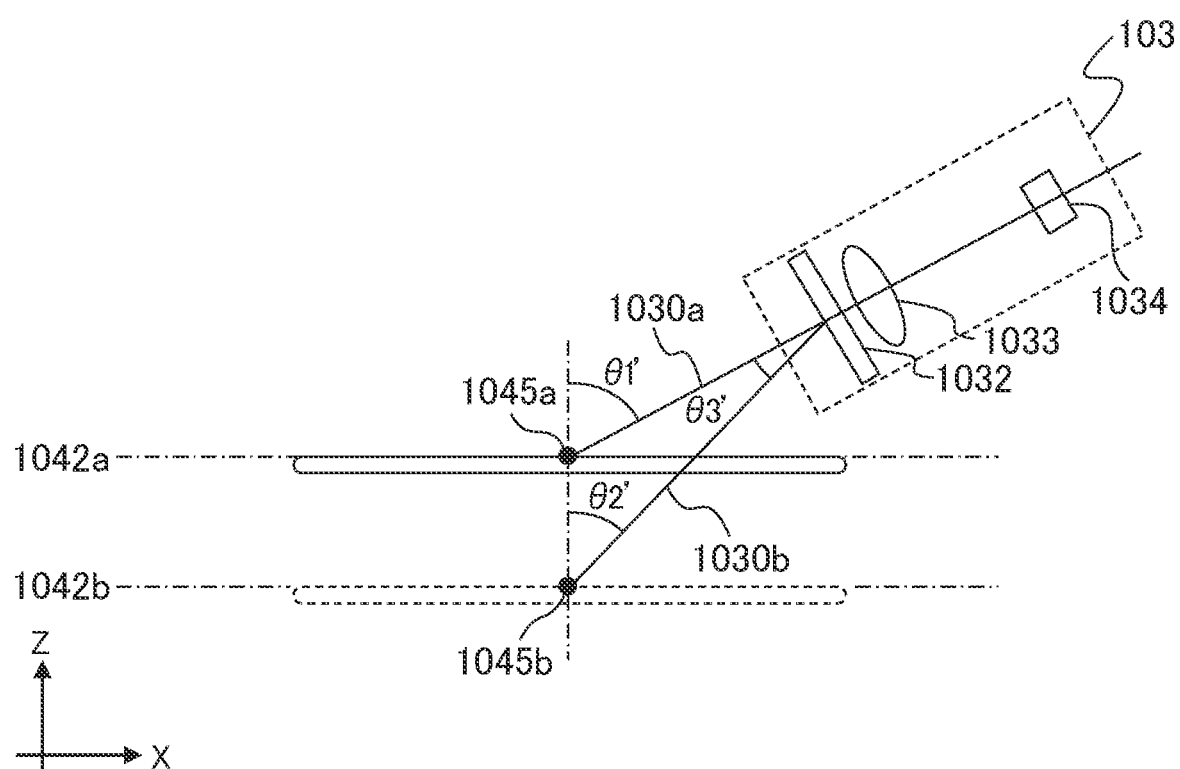
FIG. 3 is a schematic view of arrangement of an optical path adjusting element on the detection optical system side.

The detection optical system 103 is described below. First, the position of the optical path adjusting element 1032 on the detection optical system side as a feature of this embodiment is explained referring to FIG. 3. As in the explanation of the optical path dividing element 1015 on the projection optical system side, for the sake of convenience, two types of height are assumed for explanation. As explained above, the light from the projection optical system 101 enters the sample at angles θ1 and θ2. Then, the light is reflected on the sample surface at the same angles (θ1', θ2') as the incidence angles. As in the projection optical system 101, the detection optical system 103 is installed so as to detect the reflected light (first light 1030a) reflected on the height measuring point 1045a at the first height 1042a as the reference. The orientation of the detection optical system and the positions of the imaging lens 1033 and sensor 1034 are fixed.

The first light 1030a reflected at θ1' from the sample surface at the first height 1042a can be received by the sensor 1034. However, the second light 1030b reflected on the height measuring point 1045b (light reflected in the direction of angle θ2' relative to the normal direction of the sample surface) cannot be received by the sensor 1034 because it passes through a different trajectory from that of the first light.

Therefore, the optical path adjusting element 1032 is placed between the imaging lens 1033 and the sample to deflect the second light 1030b so that the second light 1030b which passed through the optical path adjusting element 1032 takes the same trajectory as the first light 1030a. Like the optical path dividing element 1015, the position of the optical path adjusting element 1032 is determined depending on the positions of the sample and the detection optical system (particularly the imaging lens 1033 and sensor 1034). Its angle is determined taking the desired angle of reflected light from the sample surface and the positions of the imaging lens 1033 and the sensor 1034 into consideration.

As mentioned above, the angle at which branching can be made is different depending on the type of optical path adjusting element 1032. Therefore, the optical path adjusting element 1032 is positioned at the optimum angle according to the angle at which it can divide the optical path and the position of the sensor.

The light reflected on the sample enters the optical path adjusting element 1032. The light is divided in a plurality of directions by the optical path dividing element 1015 of the projection optical system 101 and enters the sample at different angles. The plural light beams projected on the sample at different incidence angles are reflected in different directions and the reflected light beams oriented in the different directions enter the optical path adjusting element 1032.

Since the second light 1030b reflected on the height measuring point 1045b is different from the first light 1030a in terms of the incidence angle (trajectory) for entry into the detection optical system 103, it would arrive at a different position from the detecting surface of the sensor 1034; however, in this embodiment, the optical path adjusting element 1032 is placed so as to make the trajectory of the second light 1030b coincide with the trajectory of the first light 1030a. In order to enable such optical path adjustment, an optical path adjusting element which deflects the light in a virtual plane including both the optical path of the first light 1030a and the optical path of the second light 1030b in the projection optical system is employed. Furthermore, an optical path adjusting element which deflects the reflected light reflected on the height measuring point 1045b to make it take the same trajectory as the reflected light reflected on the height measuring point 1045a is employed.

The optical path is branched by the optical path adjusting element 1032 and the reflected light going toward the sensor 1034 forms an image on the imaging lens 1033 and after that, the light is received by the sensor 1034.

Since the projection optical system 101 has the optical path dividing element 1015 and the detection optical system 103 has the optical path adjusting element 1032 as described above, even with the second height 1042b largely different from the first height 1042a as the reference, light can be projected at an incidence angle suitable for the height without changing the imaging magnification on the detection optical system side and the reflected light from each sample height can be received by the sensor.

Next, an example of sample height measurement based on output of the sensor 1034 will be explained. When Δs represents the amount of displacement of light received by the sensor 1034, Δz represents the amount of displacement of sample height, θ represents the incidence angle, and m represents the imaging magnification, the relation between the light received by the sensor and height can be calculated in accordance with Δs=2×m×sinθ×Δz.

Figure 4A:
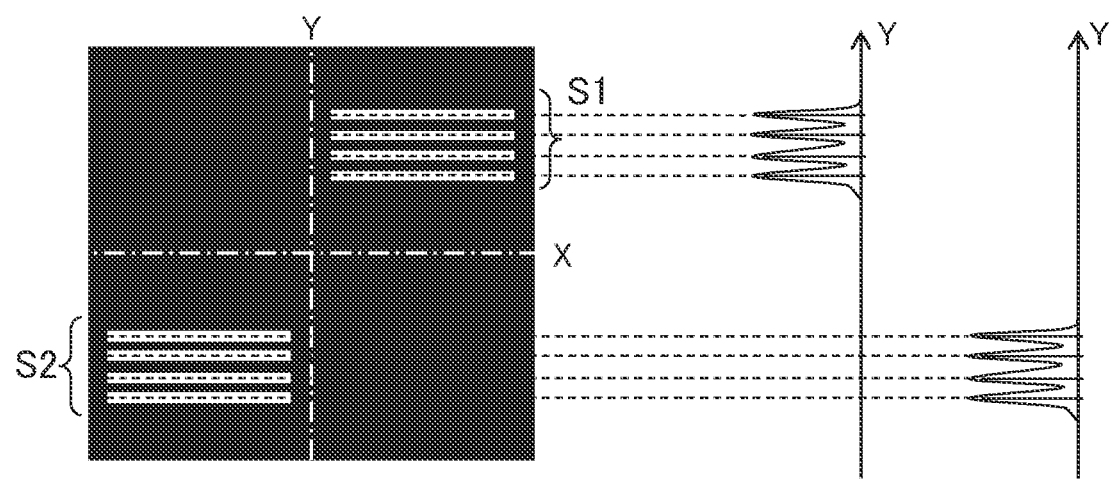
FIG. 4A is a view which shows a projection image on the sensor and intensity distribution.

Δs is explained below. FIG. 4A is a view which shows a projection image of the pattern mask 1013 which is projected on the sensor, and its intensity distribution. Since the light transmitted through the openings of the pattern mask 1013 arrives at the receiving surface of the sensor 1034, the projection image reflects the shape of the openings. In the intensity distribution, a plurality of peaks appear at positions corresponding to the plurality of openings and a plurality of peak positions can be identified. By averaging the values (Δs) related to these positions, the sample height can be measured with high accuracy. Even if peaks are not projected at positions corresponding to the actual height positions due to the difference in the sample surface material, etc., the influence can be suppressed by averaging.

Figure 4B:
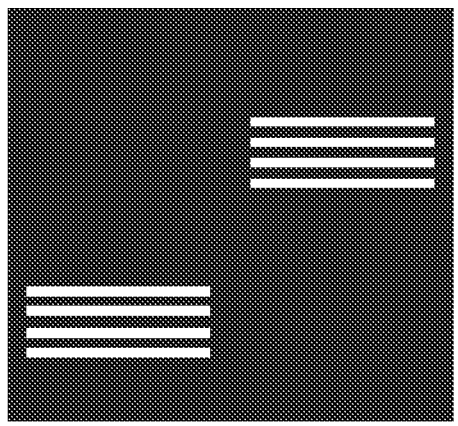
FIGS. 4B and 4C show an example of projection images at different heights.
Figure 4C:
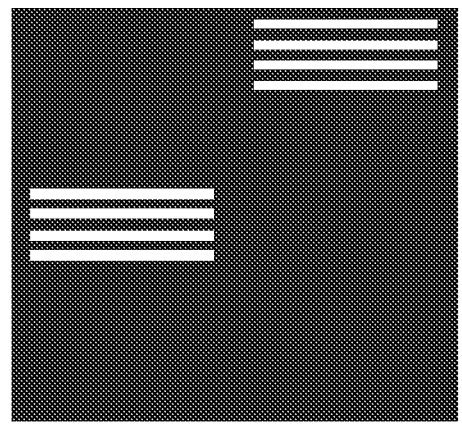

FIG. 4B shows an example of a projection image on the sensor when the sample is positioned at the first height as the reference and FIG. 4C shows an example of a projection image obtained when the stage is moved +100 μm from the first height in the height direction. The sample stage used in this embodiment has a moving mechanism for moving the sample in the x-y direction parallel to the sample surface and also a z moving mechanism for moving the sample in the z direction.

Figure 4D:
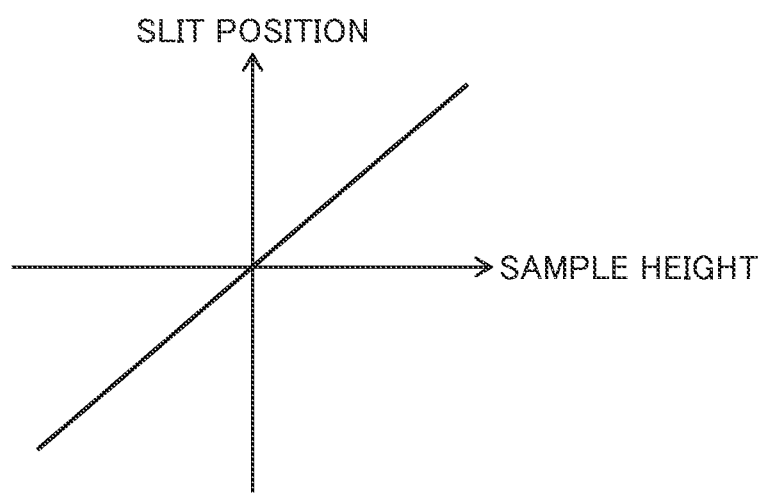
FIG. 4D is a chart of the relation between slit position and height.

The position at which an image is taken from the light transmitted through an opening varies as the height changes. Thus, the amount of displacement As of the sensor can be calculated from the information of light received by the sensor, which can be obtained from at least two different heights. FIG. 4D is a correlation chart of the image taken by plotting FIGS. 4B and 4C (opening shape positions) and height, in which the horizontal axis represents the amount of movement of opening shape (for example, slit) on the image and the vertical axis represents height. The amount of displacement of opening shape position and the amount of displacement of height are almost in a proportional relation.

Once Δs has been calculated, Δz or how much change has been made from the reference height can be calculated and the height of the sample surface can be measured. As for the incidence angle θ, as mentioned above, using the optical path dividing element 1015, the incidence angle for the first height 1042*a* and its vicinity is made θ1 and the incidence angle for the second height and its vicinity is made θ2. Thus, through the optical path dividing element 1015, the projection optical system 101 projects light on the sample at an incidence angle suitable for each height and its vicinity and the optical path adjusting element 1032 enables the sensor 1034 of the detection optical system 103 to receive the reflected light while keeping a high imaging magnification.

When the measurable height range is wide, generally the imaging magnification must be lowered. However, as mentioned above, by dividing the optical path into a plurality of paths on the projection optical system side and returning them to the desired optical path on the detection optical system side, the measurable height range can be broadened and height measurement can be made in a wide range with high accuracy while the imaging magnification is kept high.

The optical path dividing element 1015 and optical path adjusting element 1032 may be almost the same or different in characteristics. Furthermore, if the distance from the optical path dividing element 1015 to the height measuring point (1045*a*, 1045*b*) is almost the same as the distance from the height measuring point (1045*a*, 1045*b*) to the optical path adjusting element 1032 as shown in FIG. 1, the deflection angle for projection is almost the same as the deflection angle for detection, so optical arrangement and design are easy.

Second Embodiment

In this embodiment, the case that a diffraction grating is used as the optical path dividing element 1015 or the optical path adjusting element 1032 is explained. The basic structure is the same as that of the first embodiment.

The explanation is given below of the case that a diffraction grating is used as the optical path dividing element 1015 on the projection optical system side. As mentioned above, light is projected at incidence angle θ1 on the sample at the first height 1042*a* as the reference and at incidence angle θ2 on the sample at the second height 1042*b* different from it. The amount of displacement of angle of light emitted from the projection optical system 101, or θ3 can be geometrically calculated in accordance with θ3=f(L1, H1, θ1). When a diffraction grating is used as the optical path dividing element, the optimum installation position is determined according to the combination of wavelength λ of light emitted from the light source 1011, grating pitch width, relative angle θ3 of the trajectory 1010*a* and trajectory 1010*b*, and distance to the height measuring point 1045*b*.

Figure 5:
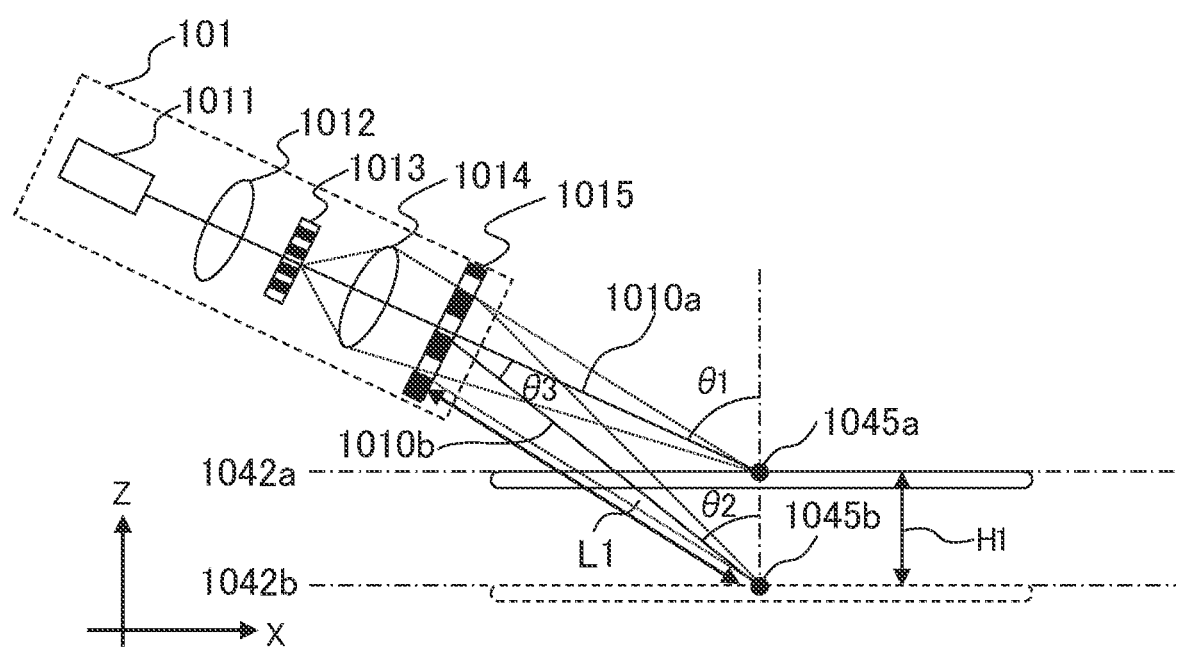
FIG. 5 is a view which shows incident light from the projection optical system in the case that a diffraction grating is used as the optical path dividing element.

FIG. 5 shows an example of the use of a diffraction grating as the optical path dividing element 1015 of the projection optical system. The diffraction grating has a plurality of grates for branching into zero-order light and diffracted light. The light emitted from the light source 1011 is branched into zero-order light and diffracted light as it passes through the optical path dividing element 1015.

Figure 6A:
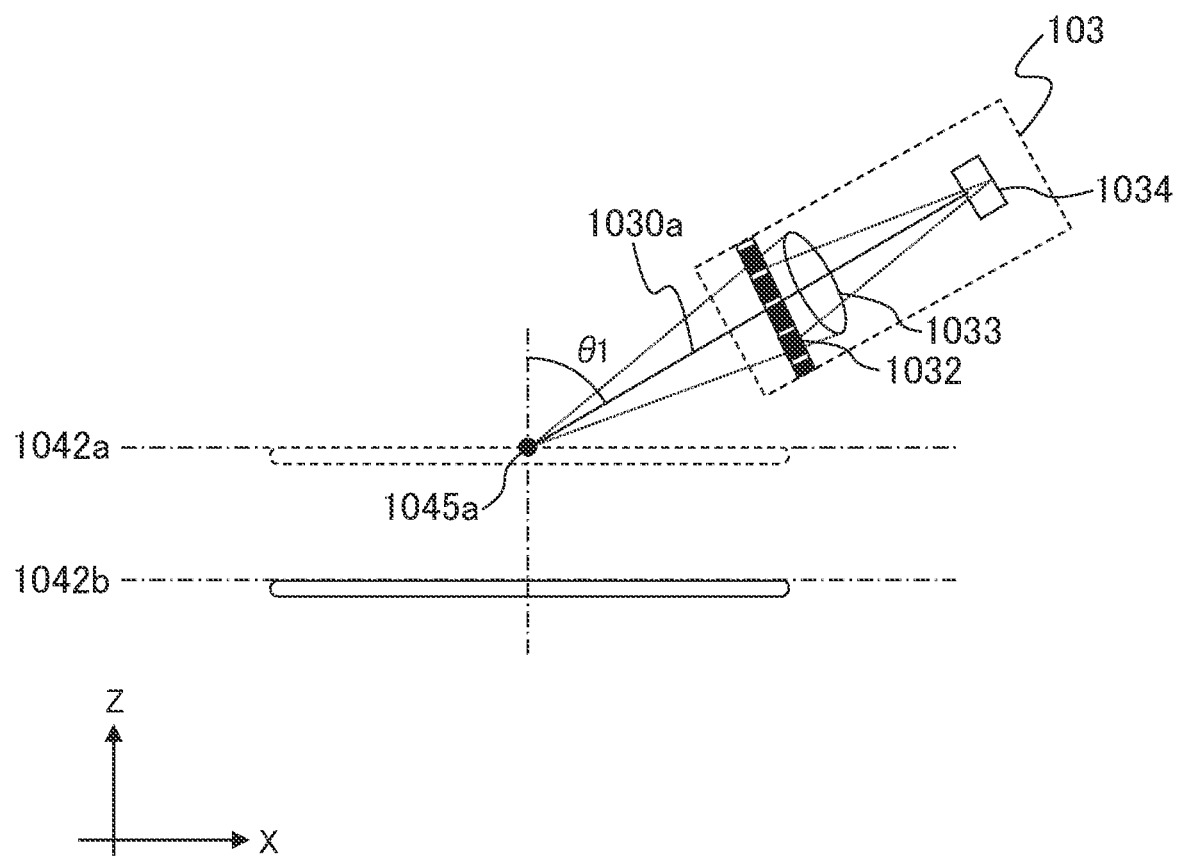
FIG. 6A is a view which shows reflected light at the first height, entering the detection optical system side in the case that a diffraction grating is used as the optical path adjusting element.
Figure 6B:
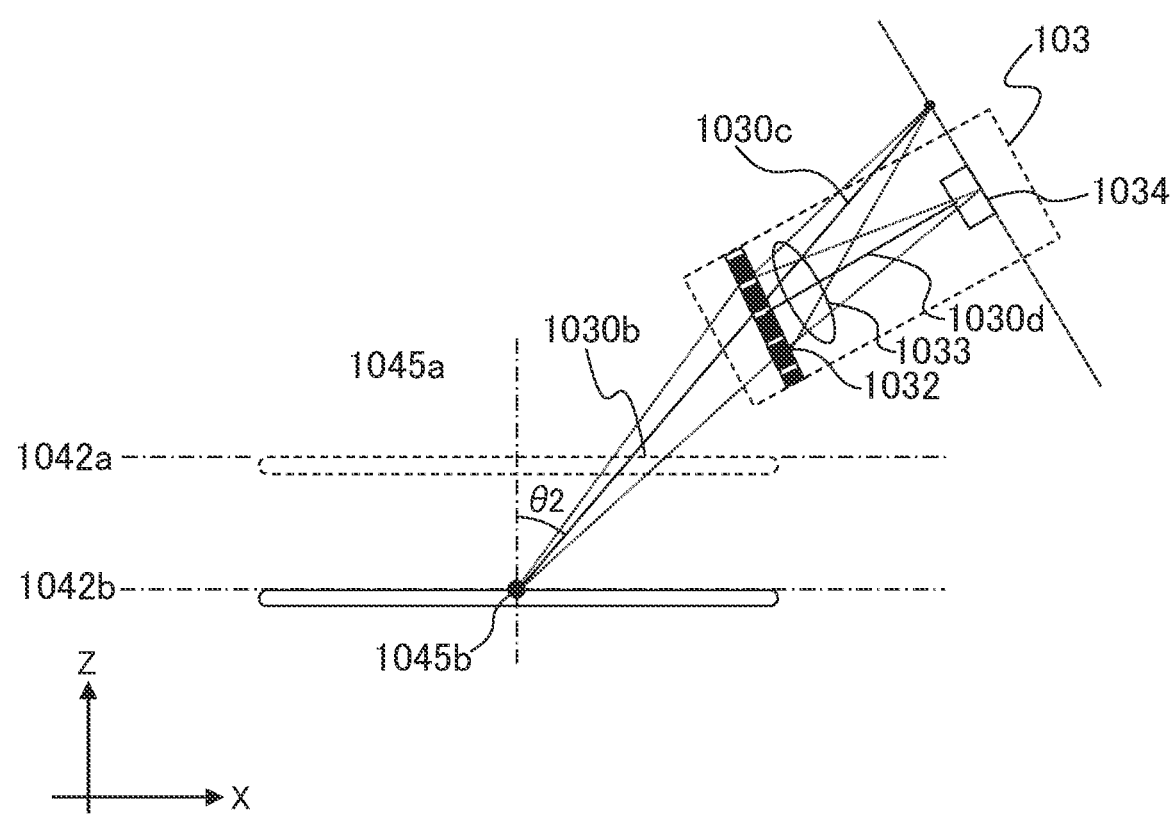
FIG. 6B is a view which shows reflected light at the second height, entering the detection optical system side in the case that a diffraction grating is used as the optical path adjusting element.

FIG. 6A and FIG. 6B show reflected light in the case that a diffraction grating is used as the optical path adjusting element 1032 on the detection optical system side. FIG. 6A and FIG. 6B illustrate the trajectory of reflected light reflected on the height measuring point 1045 with the sample surface positioned at the first height 1042*a* and with the sample surface positioned at the second height 1042*b*, respectively. If the light 1030*b* reflected from the sample at the second height 1042*b* goes forward straight, an image would be formed outside the light receiving surface of the sensor. In order for the sensor 1034 to receive the reflected light 1030*b*, the optical path must be branched toward the direction for the light to go straight into the sensor surface.

In this embodiment, a diffraction grating is employed as the optical path adjusting element 1032 so that reflected light 1030*b* is branched into zero-order light and diffracted light. The branched diffracted light goes straight into the surface of the sensor 1034 and is received by the sensor 1034.

Figure 7:
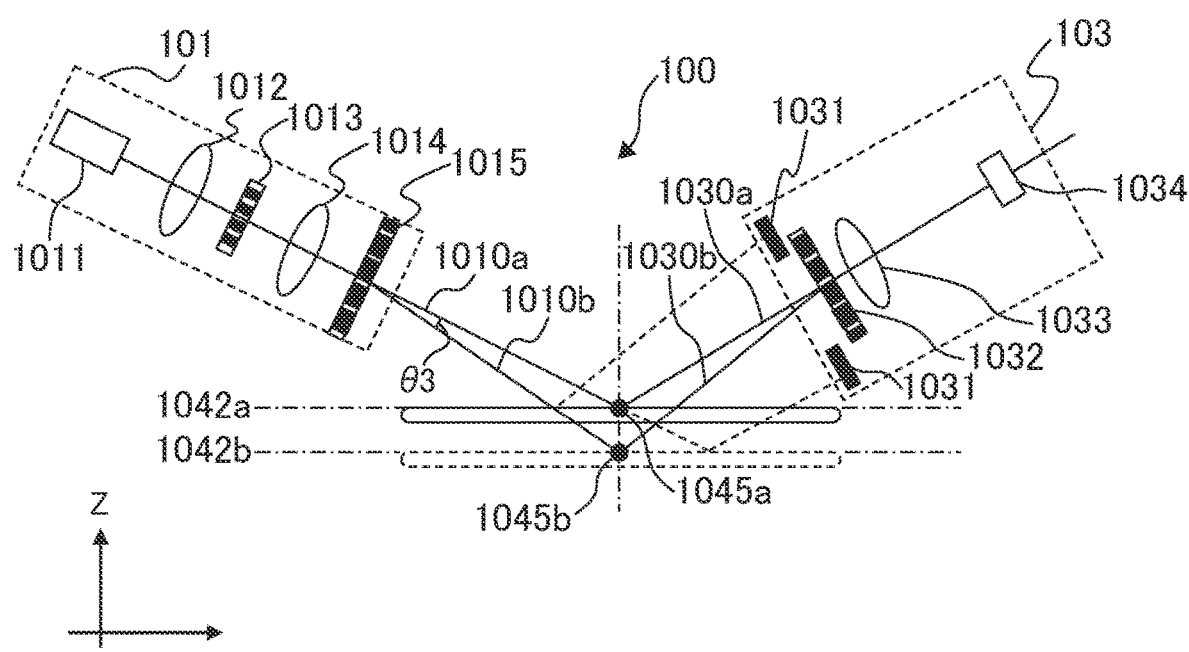
FIG. 7 is a schematic view of the optical height measurement device in the case that a diffraction grating is used as the optical path dividing element or optical path adjusting element.

FIG. 7 is a schematic view of the entire optical height measurement device in the case that a diffraction grating is used as the optical path dividing element or optical path adjusting element. The light transmitted through the optical path dividing element 1015 is branched into a plurality of different optical paths and enters the sample. As the light enters the sample at many different incidence angles, a plurality of optical paths are generated for the light reflected on the sample surface. The reflected light includes much undesired reflected light (noise component) which should not be received by the sensor. For example, a diaphragm 1031 is provided on the detection optical system side so that the diaphragm 1031 shields the reflected light (noise component) which is too diffused to enter the optical path adjusting element 1032. Other undesired reflected light (noise component) is also shielded by signal processing, optimization of the sensor size or the like. Consequently, noise components can be removed so that they do not enter the sensor 1034 and the detection accuracy of the sensor 1034 can be further increased.

Figure 8A:
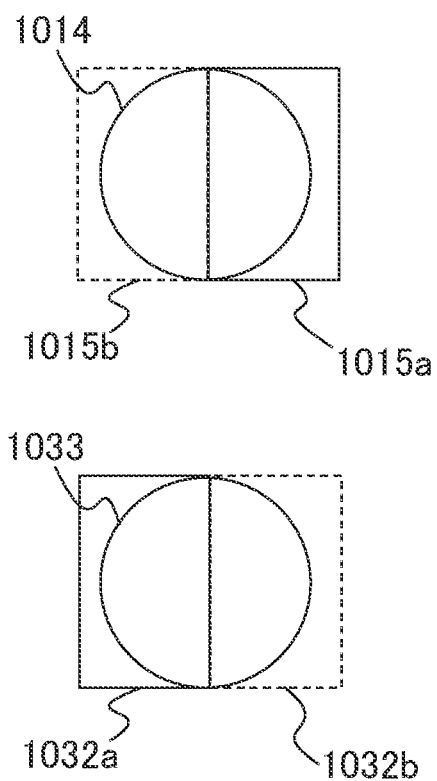
FIG. 8A is a schematic view of diffraction gratings with different left and right pitches as seen from an imaging lens.
Figure 8B:
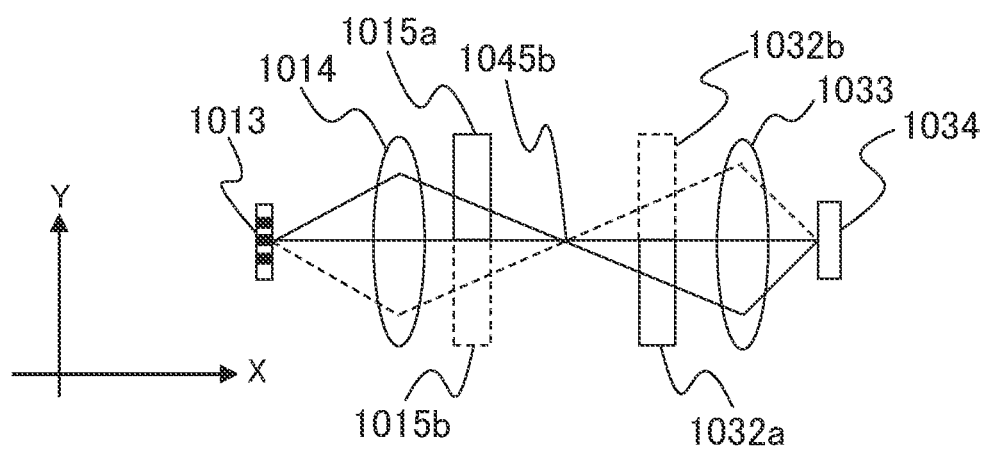
FIG. 8B is a fragmentary view of the height measurement device as looked down in the height direction, which shows the pattern mask to the sensor.

As a variation, the case that two types of diffraction gratings with different pitches are arranged left and right as the optical path dividing element 1015 or optical path adjusting element 1032 is explained below, referring to FIG. 8A and FIG. 8B. When two height measuring points are at the first height 1042*a* and the second height 1042*b* as shown in FIG. 7, branching should be made at angle θ3. However, height measuring points may be not only at the first and second heights but also at three or more heights, for example, the third and fourth heights. If the number of target sample heights is three or more, not only one branching angle θ3 but also more angles, for example, θ4 and θ5 may be needed. In this case too, as shown in FIG. 8A, a diffraction grating with different pitches can be divided and placed as 1015*a* and 1015*b* so that different branching angles θ3, θ4, and θ5 can be achieved for the respective optical paths. In this case, on the light receiving side, the arrangement should be made so that light can be received with 1032*a* and 1032*b* corresponding to them, as shown in FIG. 8B. In this case, basically the number of branch optical paths is not limited to 2.

FIG. 8B is a fragmentary view of the height measurement device as looked down in the height (z axis) direction, which shows the pattern mask 1013 to the sensor 1034. In this case, as shown in FIG. 8A, the arrangement is made so that the elements corresponding to the optical path adjusting element 1032 on the detection optical system side, namely 1015*a* has almost the same pitch as 1032*a*, and 1015*b* has almost the same pitch as 1032*b*.

Alternatively, by arranging the optical path dividing elements in series with respect to the optical axis, a plurality of diffraction directions can be achieved simultaneously. This can be achieved similarly even if a prism intended for separation by polarization, such as a Wollaston prism or Rochon prism, is employed, which does not go beyond the scope of the present invention.

If the optical path dividing element is a diffraction grating as in this embodiment, it is desirable to use a light source with a narrow wavelength band, such as a laser light source.

A white light source may be used instead of a laser light source. If that is the case, after passing through the diffraction grating, even if image formation with the same first-order diffracted light is intended the image might be continuously separated or superimposed due to the wavelength dependency of diffraction angle, resulting in blurring of the image. However, by using a Wollaston prism, etc. which branches the optical path by a polarization component as the optical path dividing element, this dependency can be reduced.

Third Embodiment

Figure 9:
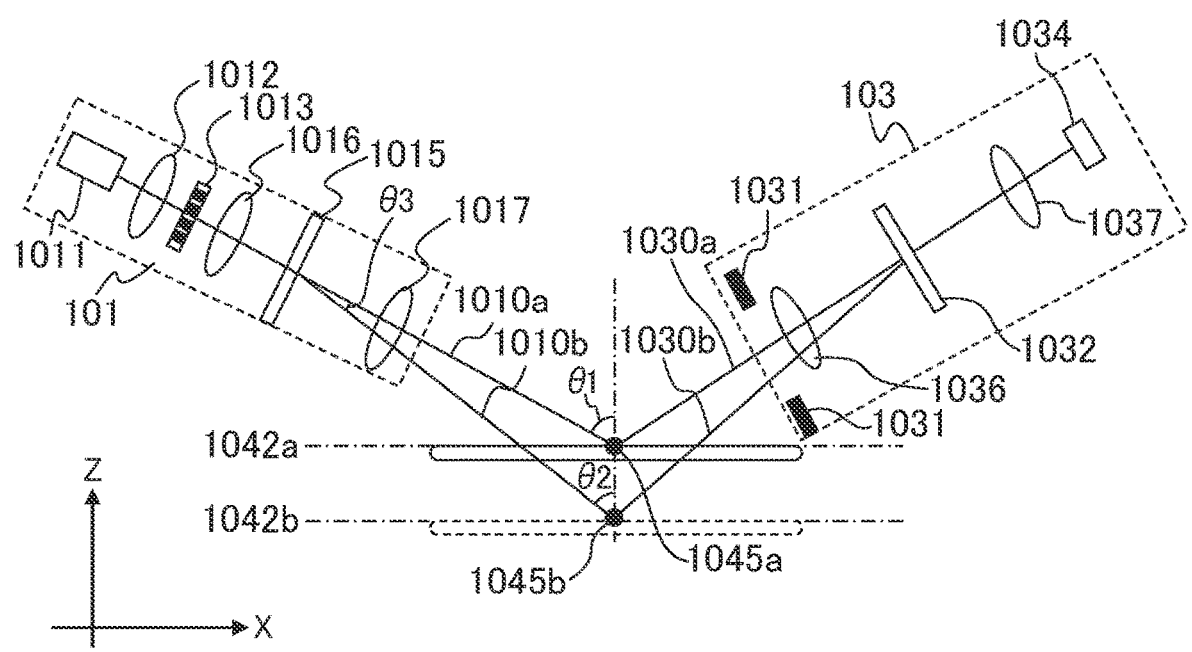
FIG. 9 is a schematic view of the optical height measurement system in the case that the imaging lens is an infinite conjugate system.

FIG. 9 shows the basic form of this embodiment. In this embodiment, as in the second embodiment, a diffraction grating is used as the optical path dividing element 1015 and the imaging lenses (1016, 1017) are arranged so as to constitute at least two infinite conjugate systems. The optical path dividing element 1015 is placed between the two imaging lenses (1016, 1017).

Similarly, the imaging lens 1033 on the detection optical system side is replaced by imaging lenses (1036, 1037) as infinite conjugate systems and the optical path dividing element 1032 is placed between the two imaging lenses (1036, 1037). In this case too, as in the second embodiment, the optical path dividing element 1015 and the optical path adjusting element 1032 can branch the optical path for incident light and reflected light and bring about the same advantageous effects as in the second embodiment.

Fourth Embodiment

Figure 10:
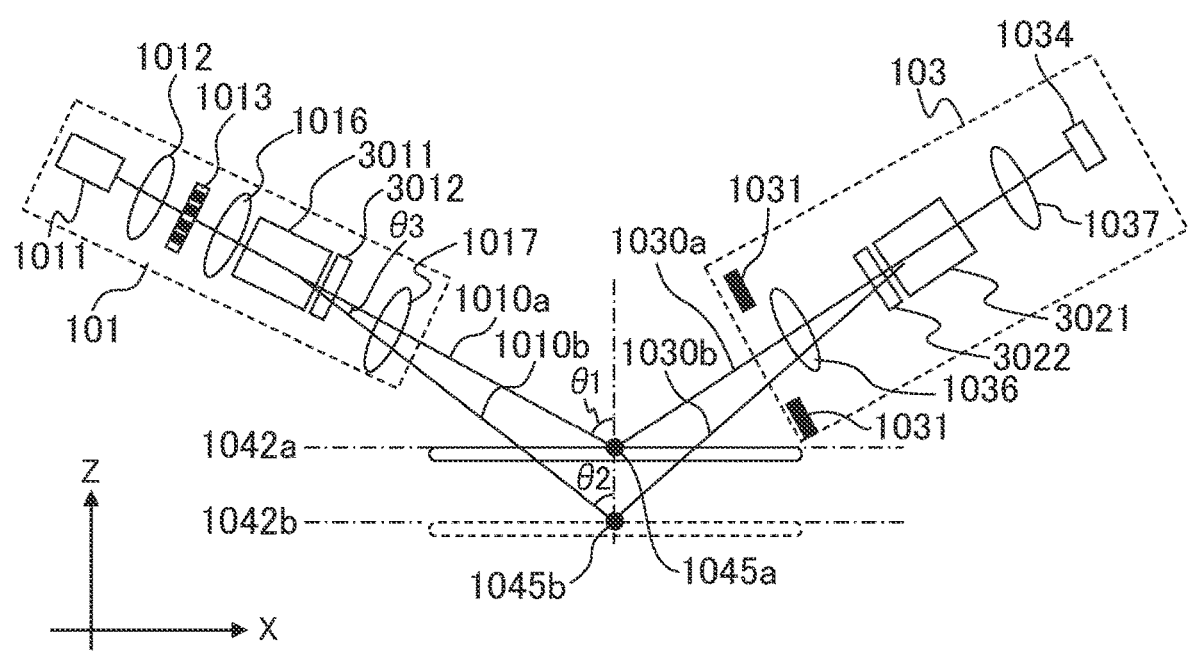
FIG. 10 is a schematic view of the optical height measurement device in the case that a birefringent element is used as the optical path dividing element or optical path adjusting element.

FIG. 10 shows the basic form of this embodiment. In this embodiment, the diffraction gratings which are used as the optical path dividing element 1015 and the optical path adjusting element 1032 in the second and third embodiments are replaced by a birefringent element 3011 and a wave plate 3012. The birefringent element 3011 may be, for example, a Wollaston prism or Rochon prism. The birefringent element 3011 can branch the optical path for each direction of polarized light. The branching angle differs depending on the element. For example, in order to generate the second light 1010*b* with incidence angle θ2 suitable for the measuring point 1045*b* at the second height 1042*b*, branching by θ3 from the first light 1010*a* as the reference is needed. In this case, an element which enables refraction by θ3 is selected, taking the wavelength λ of light emitted from the light source 1011 into consideration.

As mentioned above, the projection optical system 101 is installed to fit the first height 1042*b* as the reference and the incidence angle is fixed (1010*a*). The flow of branching the light emitted from the projection optical system 101 into an optical path at an incidence angle suitable for the measuring point 1045*b* at the second height 1042*b* is explained below. The light emitted from the light source 1011 goes through the condenser lens 1012, pattern mask 1013, and imaging lens 1014 and enters the birefringent element 3011. The light is branched according to the branching angle of the birefringent element 3011.

The light transmitted through the birefringent element 3011 is divided into linear polarized light beams which each have an orthogonal component and are different in traveling direction. In the case of linear polarized light, reflected light may have polarization dependency. This light is again converted into circular polarized light by the wave plate 3012. This can reduce the polarization dependency at the time of reflection on the sample surface.

The detection optical system 103 is also installed to fit the first height 1042*b* as the reference. The flow of receiving the desired reflected light 1030*b* from the sample at the second height 1042*b* is explained below. The second light 1010*b* obtained by optical path branching by the optical path dividing element 1015*a* on the projection optical system side forms an image on the height measuring point 1045*b* on the sample surface and is reflected. Then, the reflected light 1030*b* goes through the imaging lens 1036 on the detection optical system side to become parallel light and is converted into linear polarized light by the wave plate 3022 and the optical path of each polarized light is refracted by the birefringent element 3021. Consequently, an optical path which extends straight in the direction of the sensor 1034 can be formed and the second light 1030*b* reflected from the sample surface at the second height can be received by the sensor 1034.

The birefringent element 3011 is arranged according to the angle at which the desired reflected light 1030*b* reflected from the sample surface at the second height 1042*b* goes through the imaging lens 1033 and enters the birefringent element and the direction in which the light should go, or the angle with respect to the sensor.

Fifth Embodiment

Figure 11:
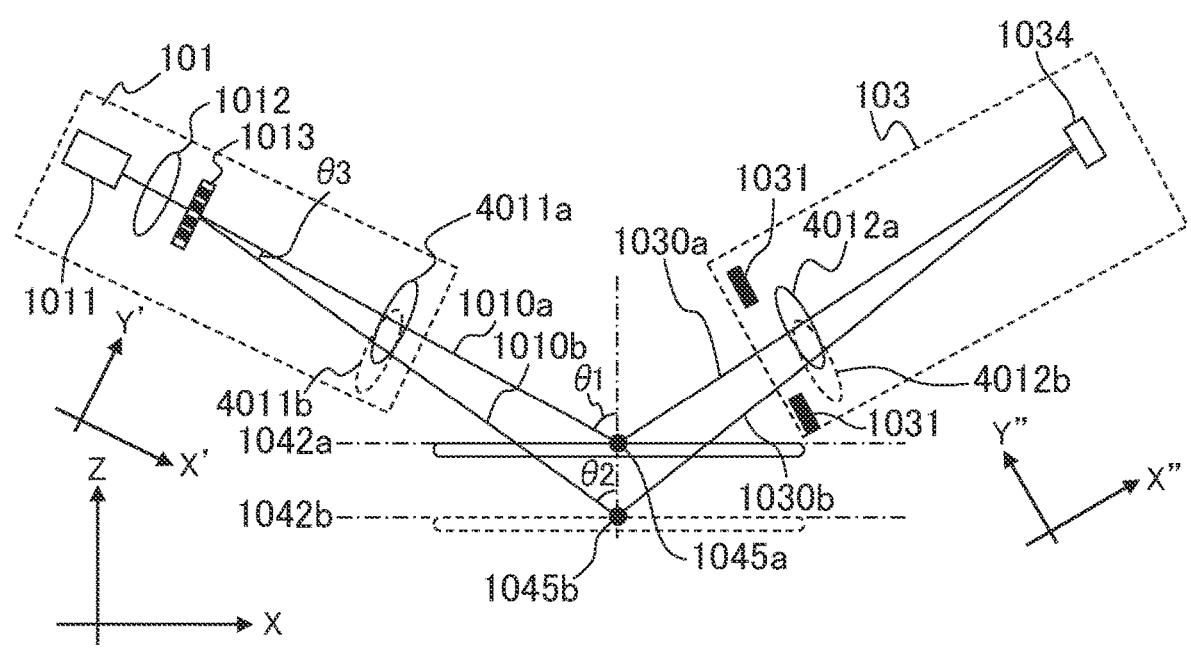
FIG. 11 is a schematic view of the optical height measurement device in the case that a split lens is used as the optical path dividing element or optical path adjusting element.
Figure 12A:
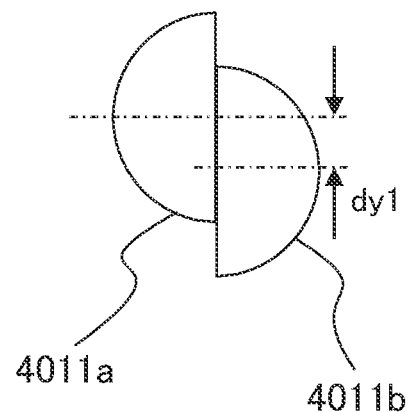
FIG. 12A shows an example of a split lens in which the left and right lenses are different.
Figure 12B:
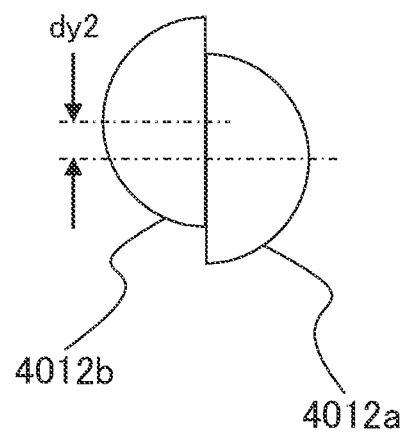
FIG. 12B shows an example of a split lens in which the left and right lenses are different.

FIG. 11 shows the basic form of this embodiment. In this embodiment, the diffraction gratings as the optical path dividing element and optical path adjusting element in the second and third embodiments are removed and the imaging lens 1014 is replaced by at least two lenses into which one lens is split (4011*a*, 4011*b*). A split lens is, for example, one lens 4011*b* which is shifted by dy1 as shown in FIG. 12A. Furthermore, on the detection optical system side 103, the imaging lens 1033 is replaced by at least two lenses into which one lens is split (4012a, 4012b) and one split lens 4012b is shifted by dy2 as shown in FIG. 12B. Generally, even if a lens has an opening with a desired shape and is used partially, the imaging relation is substantially maintained at the imaging position, so each of the split lenses (4011a, 4011b, 4012a, 4012b) can be treated as a lens which has an independent optical axis and imaging relation. The influence of aberration performance variation is considered to be small.

The first light 1010a transmitted through one split imaging lens 4011a on the projection optical system side forms an image on the height measuring point 1045a of the sample surface at the first height 1042a and is reflected and transmitted through one split imaging lens 4012a on the detection optical system side and forms an image on the sensor 1034. On the other hand, the second light 1010b transmitted through the other split imaging lens 4011b on the projection optical system side forms an image on the height measuring point 1045b of the sample surface at the second height 1042b and is reflected and transmitted through the other split imaging lens 4012b on the detection optical system side and forms an image on the sensor 1034. Next, optical path branching for the second height which uses split lenses will be explained.

Figure 12C:
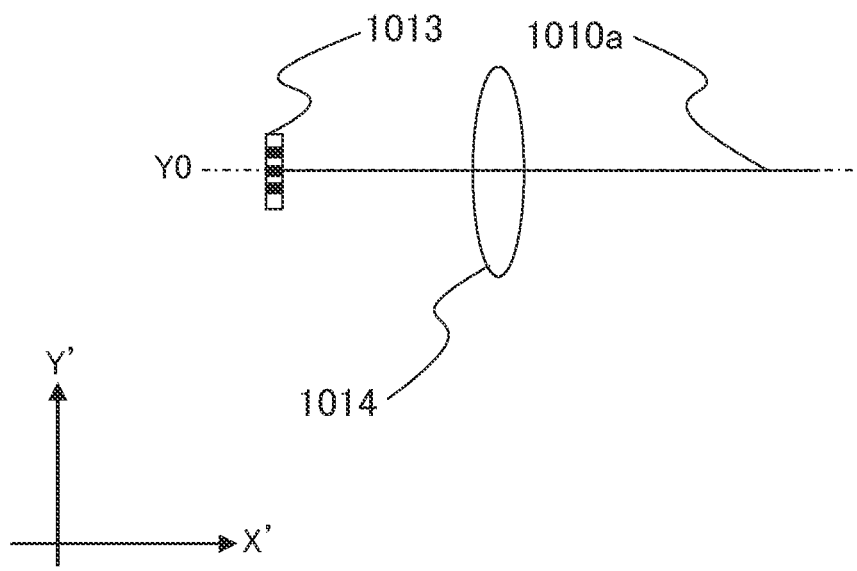
FIG. 12C is a fragmentary view of the projection optical system as looked down in the height direction, which shows the pattern mask to the imaging lens.
Figure 12D:
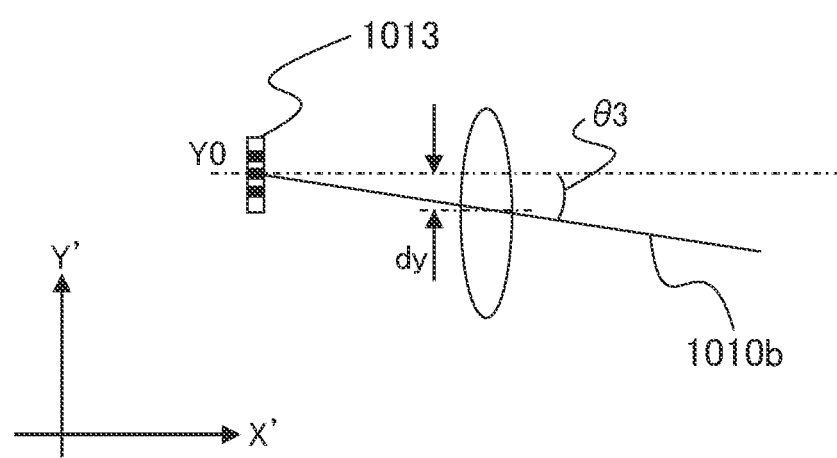
FIG. 12D is a fragmentary view of the projection optical system as looked down in the height direction, which shows the pattern mask to the imaging lens (the imaging lens is shifted from the position shown in FIG. 12C).

In order to generate the second light which forms an image on the height measuring point 1045b at the second height 1042b, the other split lens 4011b is arranged so that the center of the pattern mask 1013 is connected to the center of the lens 4011b. As shown in FIG. 12C, when the center of the pattern mask 1013 is in a straight line with the center of the imaging lens 1014, the optical axis of light 1010a emitted from the light source 1011 extends straight on the line. Let's assume that the optical axis should be shifted by dy in the Y' direction as shown in FIG. 12D. In this case, the center of the lens 4011b is shifted by angle θ3 which corresponds to the amount of shift dy in the direction Y' orthogonal to the first light 1010a. The light transmitted through the pattern mask 1013 goes straight toward the center of the shifted lens 4011b. Therefore, the optical path is displaced by θ3 from the first light 1010a.

As explained above, the center position and angle of one split lens 4011b are changed for the angle θ3 at which the optical path 1010b suitable for the second height 1042b should branch off from the optical path 1010a suitable for the first height 1042a as the reference. Consequently, the optical path suitable for the second height 1042b can branch off (FIG. 11).

The same principle applies to the case that the imaging lens 1037 is replaced by at least two split lenses (4012a, 4012b) into which one lens is split, as the optical path adjusting element 1032 on the detection optical system side. The other split lens 4012b is shifted from one split lens 4012a according to the angle at which the second light 1030b reflected at the second height 1042b enters the optical path adjusting element 1032 and its angle with respect to the sensor 1034. Consequently, the light reflected at the second height 1042b can also be received by the sensor 103.

Sixth Embodiment

Next, the arithmetic processing which is performed by a charged-particle device or the like in which the height measurement device as described in the above embodiments is mounted, and the method for controlling the device will be explained.

Figure 13:
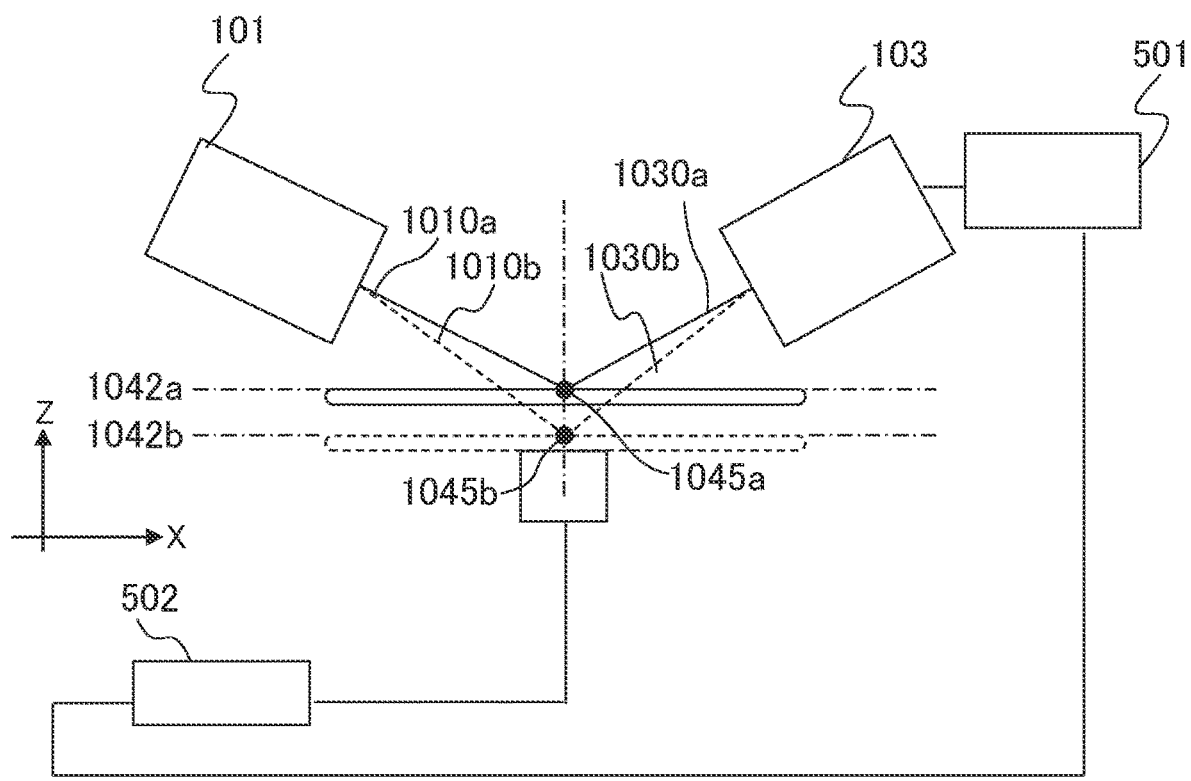
FIG. 13 is a schematic view of the route to process the light after it is received by the sensor.

FIG. 13 shows the route for processing the light received by the sensor 1034 of the detection optical system 103.

In this embodiment, an explanation is given on the assumption that the sensor is a PSD sensor. However, the sensor is not limited to a one-dimensional or two-dimensional element such as PSD, but it may be an imaging sensor such as CCD or CMOS.

The output voltage varies according to the center of gravity of reflected light received by the PSD sensor. The amount of change in the output voltage is applied to a table to calculate the height.

The center of gravity of reflected light with the sample at the first height 1042a is different from that with the sample at the second height 1042b After that, the received light information outputted from the detection optical system 103 is sent to a processing unit 501. The processing unit 501 calculates the amount of sensor displacement Δs according to the center of gravity. Then, the amount of height displacement Δz is calculated by applying the incidence angle θ from the projection optical system 101, imaging magnification and Δs to $\Delta s = 2 \times m \times \sin\theta \times \Delta z$.

The information from the processing unit 501 is sent to a control unit 502. The control unit 502 controls the stage according to the sample height information calculated by the processing unit 501.

Seventh Embodiment

In a length measurement or inspection device which uses an electron beam, higher accuracy in height measurement is demanded in order to obtain a high quality image with higher stability. On the other hand, there is the need to observe the internal structure of the sample by increasing the electron beam speed. For example, when the electron beam's energy of arrival at the sample (acceleration energy) is high, the electron beam can get to the inside of the sample and visualize the information which would be invisible on the sample surface. In addition, high resolution is required for a device which makes a length measurement or inspection using an electron beam. In order to provide high resolution in an electron beam device, it is desirable to shorten the distance between the sample surface and the objective lens (working distance: WD).

However, because of the principle that the objective lens concentrates electrons toward an ideal optical axis to converge a beam, when the beam acceleration is higher, the stronger convergence effect is needed. Also, if the working distance is short, electrons must be concentrated in a short distance, so a strong convergence effect is needed. Thus, it is difficult to achieve both a shorter working distance and higher beam energy.

Therefore, in this embodiment, an explanation is given of an electron beam device which controls the position of the stage in the height direction so that in measurement or inspection using a low-energy beam, priority is given to the resolution and the working distance is decreased, and in measurement or inspection using a high-energy beam, priority is given to electron concentration and the working distance is increased.

Figure 14:
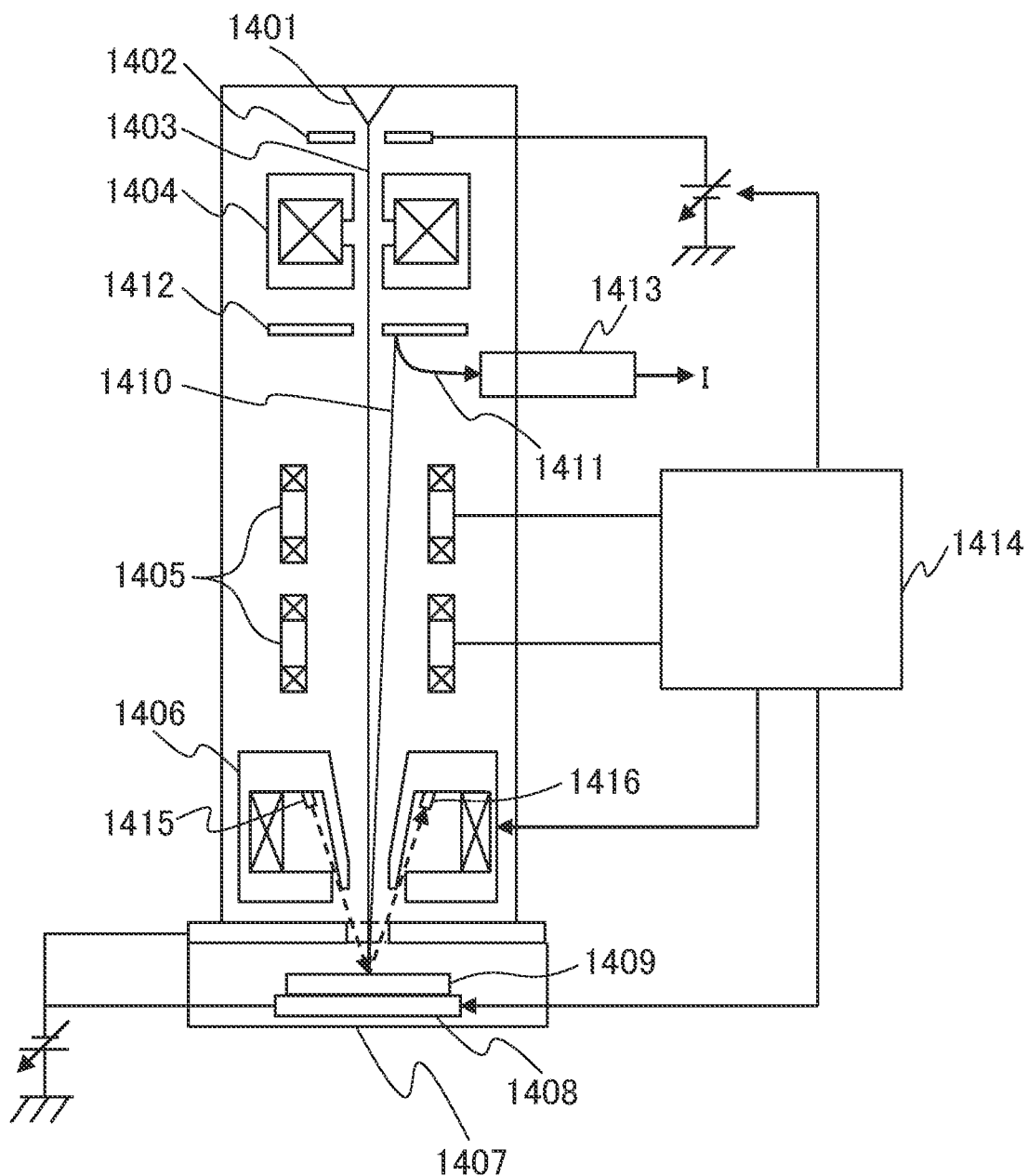
FIG. 14 is a view which shows the general structure of a scanning electron microscope.

FIG. 14 is a schematic view which shows the structure of a scanning electron microscope as an example of a charged-particle beam device. The electron beam extracted from an electron source 1401 by an extraction electrode 1402 and accelerated by an acceleration electrode (not shown) enters a condenser lens 1404 as a form of focusing lens along the ideal optical axis 1403 of the beam and is narrowed down, and then scanned over a sample 1409 one-dimensionally or two-dimensionally by a scanning deflector 1405. The electron beam is decelerated by the negative voltage applied to the electrode built in a sample stage 1408 and converged by the lens effect of an objective lens 1406 and radiated on the sample 1409.

As the electron beam is radiated on the sample 1409, electrons 1410 such as secondary electrons and backscattered electrons are emitted from the irradiated spot. The emitted electrons 1410 are accelerated toward the electron source by the acceleration effect based on the negative voltage applied to the sample and collide a conversion electrode 1412 and generate secondary electrons 1411. The secondary electrons 1411 emitted from the conversion electrode 1412 are trapped by a detector 1413 and output I of the detector 1413 changes depending on the amount of trapped secondary electrons. The brightness of a display device (not shown) changes depending on the output I. For example, for formation of a two-dimensional image, a deflection signal to the scanning deflector 1405 and output I of the detector 1413 are synchronized to form an image of the scan area. The scanning electron microscope illustrated in FIG. 14 includes a deflector (not shown) which moves the scan area for the electron beam.

Although the example in FIG. 14 is explained as an example that the electrons emitted from the sample are once converted by the conversion electrode and detected, obviously the invention is not limited to this structure. For example, an electron-multiplier tube or the detecting surface of the detector may be placed over the trajectory of accelerated electrons. A control unit 1414 controls the components of the scanning electron microscope and also has the function to form an image according to the detected electrons and the function to measure the pattern width of a pattern formed on the sample according to the intensity distribution of detected electrodes called a line profile.

In addition, the electron beam device illustrated in FIG. 14 has a height measurement device which includes a light source 1415 and a light receiving element 1416. The height measurement device is, for example, the same as the one illustrated in FIG. 1 and the like. A sample chamber 1407 houses an x-y drive mechanism to move the sample stage 1408 in the x-y direction and a z drive mechanism to move it in the z direction. These drive mechanisms are controlled by a control signal supplied from the control unit 1414.

The optical elements which constitute the height measurement device are installed so that the beam trajectory of the projection optical system and the beam trajectory of the detection optical system in the height measurement device are mirror-symmetric with a virtual plane including the ideal optical axis 1403, as the mirror surface.

Furthermore, the control unit 1414 controls the z drive mechanism according to output of the height measurement device and also controls the excitation current of the objective lens 1406 according to output of the height measurement device (Z sensor). The control unit 1414 controls the lens condition (excitation current) of the objective lens 1406 according to information on the relation between the previously stored output of the height measurement device and the control signal for the objective lens 1406.

Figure 15:
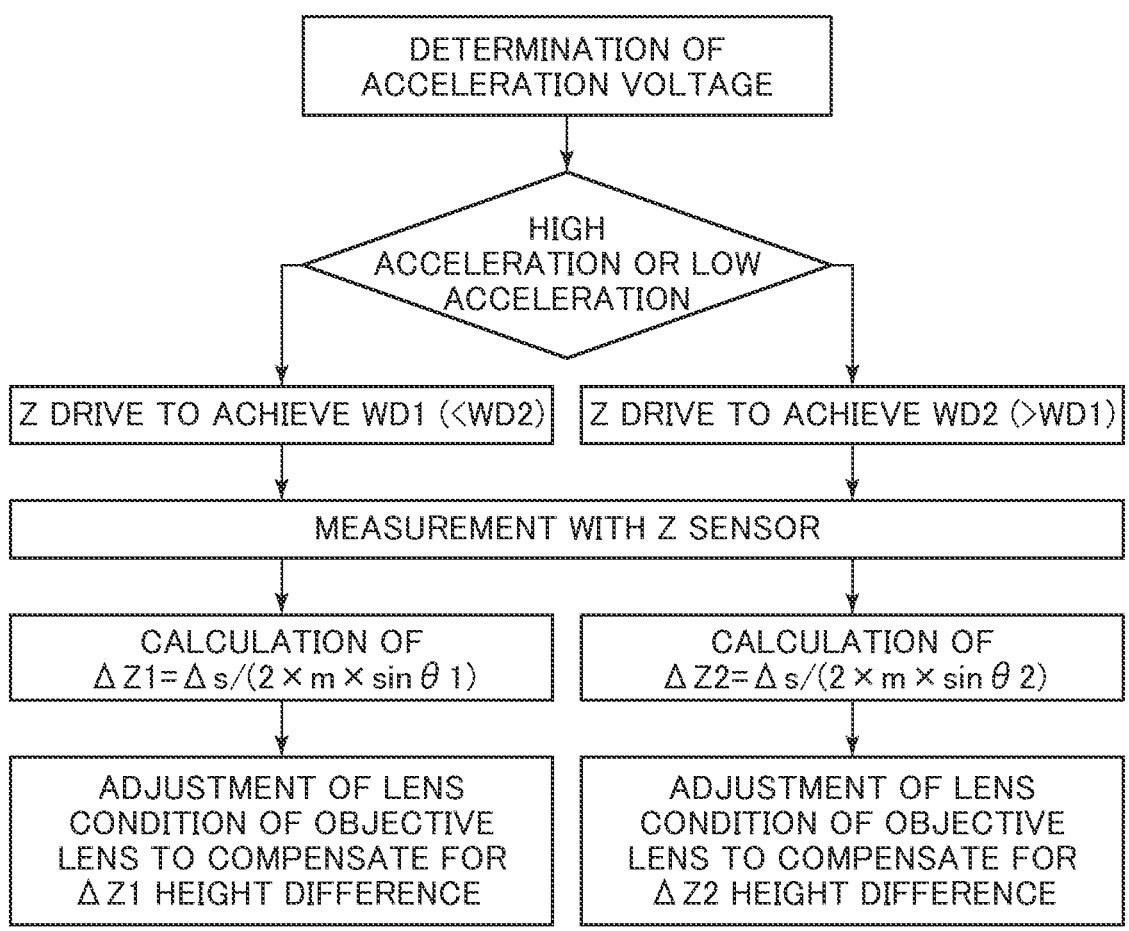
FIG. 15 is a flowchart which shows the process to adjust the device condition according to a set beam condition.

FIG. 15 is a flowchart which shows the process to control the scanning electron microscope to perform stage control and height measurement according to the set beam condition (acceleration voltage or beam's energy of arrival at the sample). First, the control unit 1414 reads the condition preset by an operation program (recipe), etc., such as acceleration voltage and if a low acceleration is preset, the control unit 1414 controls the z drive mechanism to achieve WD1 (<WD2) and if a high acceleration is preset, it controls the z drive mechanism to achieve WD2 (>WD1). In order to identify whether the acceleration is high or low, a preset threshold may be used for decision or information to identify high acceleration or low acceleration may be previously given to a specific acceleration voltage so that a decision is made according to the identification information. Furthermore, the working distance or sample height (for example, height difference between a prescribed reference position and the sample surface) may be directly set so that the z drive mechanism is controlled according to the setting.

Next, height measurement is made using the Z sensor. At this time, if WD1 is set in the recipe, $\Delta z1 = \Delta s/(2 \times m \times \sin\theta 1)$ is calculated as a value related to sample height or if WD2 is set, $\Delta z2 = \Delta s/(2 \times m \times \sin\theta 2)$ is calculated, in order to obtain the difference between sample surface height and reference height. $\theta 1$ is a relative angle between the ideal optical axis of the electron beam with WD1 and the projected light trajectory of the projection optical system, and $\theta 2$ is a relative angle between the ideal optical axis of the electron beam with WD2 and the projected light trajectory of the projection optical system.

Although in this embodiment an example that calculations are made using the above arithmetic equations is explained, instead a table indicating the relation between $\Delta z$ and $\Delta s$ may be created in advance so that $\Delta z$ is outputted by reference to the table. The control unit 1414 identifies the lens condition using the relational expression or table of $\Delta z$ and the lens condition of the objective lens and controls the objective lens 1406.

Also, an arithmetic equation or table which indicates the relation between $\Delta$Obj (difference in the excitation current (beam converging condition) for the objective lens) instead of $\Delta z$ and $\Delta s$ may be prepared so that the excitation current for the objective lens is adjusted according to input of $\Delta s$.

In the case of a device which adjusts the focus by controlling the z drive mechanism, the z drive mechanism may be controlled to offset the above $\Delta z$ or an arithmetic equation or table which indicates the relation between $\Delta s$ and the amount of stage movement $\Delta m$ may be prepared so that the z drive mechanism is controlled using such information.

So far, height measurement and device condition adjustment have been explained, but height measurement and device condition adjustment are not limited to the above embodiments and include various variations. The above embodiments can be applied to a wide range of devices in which a sample is placed at a plurality of different heights and the height is detected before processing, such as a charged-particle beam device and an optical inspection device.

The above embodiments have been described for easy understanding of height measurement and the device condition setting method, but the present invention is not limited to a structure which includes all the elements described above. An element of an embodiment may be replaced by an element of another embodiment or an element of another embodiment may be added to an embodiment. For an element of each embodiment, addition of another element, deletion, or replacement can be made.

LIST OF REFERENCE SIGNS

100 . . . height measurement device,
101 . . . projection optical system,
1011 . . . light source,
1012 . . . condenser lens, 1013 . . . pattern mask,
1014 . . . imaging lens,
1015 . . . optical path dividing element,
1016, 1017, 1036, 1037 . . . imaging lens (infinite conjugate system),
103 . . . detection optical system,
1031 . . . diaphragm,
1032 . . . optical path adjusting element,
1033 . . . imaging lens,
1034 . . . sensor,
1042a . . . first height,
1042b . . . second height,
3011, 3021 . . . birefringent element,
3012, 3022 . . . wave plate,
4011a, 4011b, 4012a, 4012b . . . split lens,
501 . . . processing unit,
502 . . . control unit

The invention claimed is:

1. A beam irradiation device comprising:
a beam source;
an objective lens for converging a beam emitted from the beam source;
a stage for retaining a sample irradiated with the beam emitted from the beam source;
a stage driving unit which moves the stage in a direction of irradiation of the beam;
a projection optical system for projecting light toward a point at which the sample is irradiated with the beam;
a detection optical system for receiving reflected light of the light projected by the projection optical system; and
a control unit for controlling at least one of the objective lens and the stage driving unit on the basis of a signal outputted from the detection optical system, wherein
the projection optical system is provided with a light source for emitting light and an optical path dividing element for branching an optical path of the light emitted from the light source, into a plurality of optical paths projected on the sample at different incidence angles,
the detection optical system is provided with a sensor for receiving the plurality of reflected light from the sample and an element for adjusting the optical path of the plurality of reflected light from the sample to a direction of the sensor prior to reception of the light by the sensor,
when a first sample height or a first working distance is set, the control unit outputs a value related to sample height or a lens condition of the objective lens, based on calculation using a previously stored first arithmetic equation or reference to a first table, and when a value related to a second sample height or a second working distance is set, the control unit outputs the sample height or the lens condition of the objective lens, based on calculation using a previously stored second arithmetic equation or reference to a second table, and
when the first sample height or the first working distance is set, the control unit calculates difference Δz1 between sample surface height and reference height in accordance with Equation 1 and when the second sample height or the second working distance is set, the control unit calculates difference Δz2 between sample surface height and reference height in accordance with Equation 2, $$\Delta z1 = \Delta s/(2 \times m \times \sin\theta 1) \quad \text{(Equation 1)},$$

$$\Delta z2 = \Delta s/(2 \times m \times \sin\theta 2) \quad \text{(Equation 2)},$$

Δs: displacement between reference position on the sensor and light receiving position,
m: imaging magnification of the detection optical system,
θ1: relative angle between an ideal optical axis of the beam with the first working distance and a projected light trajectory of the projection optical system,
θ2: relative angle between an ideal optical axis of the beam with the second working distance and a projected light trajectory of the projection optical system.

2. The optical height measurement device according to claim 1, wherein the projection optical system has a pattern mask in which an opening to transmit the light from the light source partially is made.

3. The optical height measurement device according to claim 2,
wherein the pattern mask has a plurality of openings.

4. The optical height measurement device according to claim 2,
wherein at least one of the optical path dividing element and the optical path adjusting element is a diffraction grating.

5. The optical height measurement device according to claim 2,
wherein at least one of the optical path dividing element and the optical path adjusting element is a birefringent element.

6. The optical height measurement device according to claim 5,
wherein a wave plate is provided between the birefringent element of the projection optical system or the detection optical system and the sample.

7. The optical height measurement device according to claim 2,
wherein at least one of the optical path dividing element and the optical path adjusting element is a lens which is split into two or more lenses.

8. The optical height measurement device according to claim 1,
wherein the detection optical system has a diaphragm for shielding light of the reflected light which is out of a height detection area.

9. The optical height measurement device according to claim 1, wherein the optical path dividing element is placed at a position that a relative angle between first trajectory connecting the optical path dividing element and first measuring point and second trajectory connecting the optical path dividing element and second measuring point is calculated by using L1, H1, and Theta1,
L1: distance between the optical path dividing element and the second measuring point,
H1: height difference between the first measuring point and the second measuring point,
Theta1: incidence angle of the first trajectory.

* * * * *